United States Patent
Yoshizawa

(10) Patent No.: US 9,434,607 B2
(45) Date of Patent: Sep. 6, 2016

(54) MEMS DEVICE

(71) Applicant: SEIKO EPSON CORPORATION, Tokyo (JP)

(72) Inventor: Takahiko Yoshizawa, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/660,157

(22) Filed: Mar. 17, 2015

(65) Prior Publication Data

US 2015/0266721 A1    Sep. 24, 2015

(30) Foreign Application Priority Data

Mar. 24, 2014  (JP) ................. 2014-059445

(51) Int. Cl.
*B81B 7/00* (2006.01)
*B81B 7/02* (2006.01)
*B81C 1/00* (2006.01)

(52) U.S. Cl.
CPC .... *B81C 1/00246* (2013.01); *B81B 2201/0271* (2013.01); *B81B 2203/0136* (2013.01); *B81C 2203/0163* (2013.01); *B81C 2203/0764* (2013.01)

(58) Field of Classification Search
CPC ...... B81B 7/0051; B81B 7/0006; B81B 7/02
USPC ....................................... 257/414
See application file for complete search history.

(56) References Cited

U.S. PATENT DOCUMENTS

| | | | |
|---|---|---|---|
| 5,963,788 A * | 10/1999 | Barron ................ | B81C 1/00246 148/DIG. 105 |
| 8,148,811 B2 | 4/2012 | Shinogi et al. | |
| 8,742,872 B2 | 6/2014 | Iwasaki et al. | |
| 2007/0026559 A1* | 2/2007 | Haluzak ............. | G02B 26/0833 438/50 |
| 2012/0104593 A1* | 5/2012 | Kanemoto .......... | B81C 1/00333 257/729 |

FOREIGN PATENT DOCUMENTS

| JP | 2009-059941 A | 3/2009 |
|---|---|---|
| JP | 5192610 B2 | 5/2013 |
| WO | 2008/023826 A1 | 2/2008 |

* cited by examiner

*Primary Examiner* — Cuong Q Nguyen
*Assistant Examiner* — Tong-Ho Kim
(74) *Attorney, Agent, or Firm* — Oliff PLC

(57) ABSTRACT

A MEMS device includes a semiconductor substrate having a main surface with a first region in which a trench is formed and a second region in which an impurity diffusion region of a semiconductor circuit element is formed; a functional element provided, either directly or via an insulating film, on a bottom surface of the trench of the semiconductor substrate; a wall portion in the trench of the semiconductor substrate and forming a cavity surrounding the functional element; a lid portion that covers the cavity; and a pillar in the cavity and in contact with either the bottom surface of the trench of the semiconductor substrate or the insulating film, and with a back surface of the lid portion.

16 Claims, 6 Drawing Sheets

MEMS DEVICE

The present application claims priority to Japanese Patent Application JP 2014-059445, filed Mar. 24, 2014, the entire disclosure of which is hereby incorporated by reference.

BACKGROUND

1. Technical Field

Various embodiments of the present invention relate to, for example, a MEMS (Micro Electro Mechanical Systems) device in which a functional element, such as a resonator, a sensor and an actuator, and/or an electronic circuit are integrated on one substrate.

2. Related Art

For example, in a MEMS device that includes a resonator with capacitance as a functional element, the resonator is airtightly sealed, in a vacuum state, in a cavity formed in a substrate. Also, even in the case of a functional element that does not require airtight vacuum seal, the functional element is airtightly sealed in a cavity so as to prevent the influences of dust, moisture, and the like.

Traditionally, in a case where such a functional element and a semiconductor circuit element are integrated on one semiconductor substrate, a cavity is formed by providing the functional element on the semiconductor substrate and surrounding the functional element with an insulating film and the like. Therefore, a layer(s) above the cavity is not polished, and there is no consideration for the strength of a formation structure of the cavity against mechanical stress caused by polishing.

On the other hand, in a case where a trench is formed in a semiconductor substrate and a cavity is formed in the trench, it is possible to provide an insulating layer on a lid portion covering the cavity and to form wiring on the insulating layer. In order to form wiring on the insulating layer, it is preferable that a surface of the insulating layer provided on the lid portion be planarized by treating the insulating layer by CMP (Chemical Mechanical Polishing). At this time, if a cavity structure does not have a sufficient strength against mechanical stress, there is a possibility that the lid portion deforms and the airtightness of the cavity and the properties of a functional element are impaired.

As related art, JP-A-2009-59941 (paragraphs 0013 and 0014, FIG. 1) discloses an airtight package that can maintain high airtightness of a cavity, which houses a MEMS device, while being small in size and thickness. This airtight package is also high in quality and reliability. In this airtight package, the cavity that houses the MEMS device is formed by joining a MEMS device substrate and an IC substrate to each other via a frame portion.

On the other hand, WO 2008/023826 (Abstract, paragraph 0003, FIG. 5) discloses a semiconductor device in which a cavity space can easily be provided in a specific region in a case where a semiconductor substrate and a supporting member are bonded to each other via an adhesive layer. This semiconductor device includes a semiconductor substrate, a plurality of columnar structures that are formed on the semiconductor substrate and surround a region of the semiconductor substrate where a cavity is to be formed, and a supporting member bonded to a surface of the semiconductor substrate via an adhesive layer and the columnar structures. In this semiconductor device, a device element is sealed in a cavity surrounded by the semiconductor substrate, the columnar structures and the supporting member.

Furthermore, Japanese Patent No. 5192610 (paragraph 0017, FIG. 1) discloses a MEMS device having a structure which prevents stress from being applied to an electrode in a direction in which the electrode comes close to a movable portion when external pressure is applied during resin transfer molding and the like. This MEMS device includes a substrate and a sealing membrane. A movable portion which vibrates mechanically, and an electrode which is positioned close to the movable portion are provided between the substrate and the sealing membrane. The movable portion and the electrode have a region where the movable portion and the electrode overlap each other with a gap in a direction perpendicular to a surface of the substrate. A first cavity and a second cavity which are separated by the electrode are formed between the substrate and the sealing membrane. The first cavity is positioned on aside of the movable portion in the direction perpendicular to the surface of the substrate when viewed from the electrode at the region where the movable portion and the electrode overlap. The second cavity is positioned on a side opposite to the movable portion in the direction perpendicular to the surface of the substrate when viewed from the electrode at the region where the movable portion and the electrode overlap. An inner surface of a side wall in contact with the electrode, of the first cavity, is positioned more inside than an inner surface of a side wall in contact with the electrode, of the second cavity, in a direction parallel to the surface of the substrate.

JP-A-2009-59941 (paragraphs 0013 and 0014, FIG. 1), WO 2008/023826 (abstract, paragraph 0003, FIG. 5) and Japanese Patent No. 5192610 (paragraph 0017, FIG. 1) are examples of related art.

In JP-A-2009-59941 (paragraphs 0013 and 0014, FIG. 1), a plurality of substrates are used to form a cavity. Therefore, a MEMS device and a semiconductor circuit element cannot be integrated on one substrate. On the other hand, in WO 2008/023826 (Abstract, paragraph 0003, FIG. 5) and Japanese Patent No. 5192610 (paragraph 0017, FIG. 1), a cavity is formed on a single substrate. However, they disclose neither formation of a cavity in a trench of a substrate, nor planarization of a surface of an insulating layer formed on a layer(s) above the cavity.

SUMMARY

An advantage of some aspects of various embodiments of the invention is that, in a MEMS device in which a functional element and a semiconductor circuit element are integrated on one semiconductor substrate, the mechanical strength of a structure of a cavity that houses the functional element in a trench of the semiconductor substrate is improved, and a lid portion that covers the cavity is prevented from deforming under mechanical stress.

A MEMS device according to an embodiment includes a semiconductor substrate having a main surface with a first region in which a trench is formed and a second region in which an impurity diffusion region of a semiconductor circuit element is formed; a functional element that is provided, either directly or via an insulating film, on a bottom surface of the trench of the semiconductor substrate; a wall portion in the trench of the semiconductor substrate and forming a cavity surrounding the functional element; a lid portion that covers the cavity; and a pillar in the cavity and in contact with either the bottom surface of the trench of the semiconductor substrate or the insulating film, and with a back surface of the lid portion.

According to an embodiment, the following are provided: the wall portion that forms the cavity surrounding the functional element that is provided, either directly or via the insulating film, on the bottom surface of the trench of the semiconductor substrate; and the lid portion that covers the cavity. Furthermore, in the cavity, the pillar is provided that is in contact with either the bottom surface of the trench of the semiconductor substrate or the insulating film, and with the back surface of the lid portion. This makes it possible to improve the mechanical strength of a structure of the cavity that houses the functional element in the trench of the semiconductor substrate, and to prevent the lid portion, which covers the cavity, from deforming under mechanical stress.

Here, the MEMS device may further include an insulating layer that covers the main surface of the semiconductor substrate provided with the lid portion and the semiconductor circuit element. In this way, a wiring layer can be installed, using a standard semiconductor wafer process, on a layer(s) above the cavity that houses the functional element, similarly to a layer(s) above the semiconductor circuit element. Accordingly, a degree of freedom of design of the MEMS device is improved.

In this case, it is preferable that a surface of the insulating layer on the lid portion be treated by CMP (Chemical Mechanical Polishing). In this way, the surface of the insulating layer on the lid portion is planarized, and formation of wiring on the insulating layer is made easy.

The above-mentioned pillar may be in contact with a central part of the back surface of the lid portion. As the central part deforms most easily in the lid portion, by supporting the central part of the back surface of the lid portion with the pillar, deformation of the lid portion can be prevented effectively. Also, at least apart of the functional element may constitute the pillar. In this way, the space in the cavity can be utilized effectively.

Alternatively, the pillar may be constructed integrally with the wall portion. In this way, the position of the pillar is fixed by the wall portion. Accordingly, displacement and tilting of the pillar caused by mechanical stress applied to a layer(s) above the cavity can be prevented.

Alternatively, the pillar may be provided in a central part between the functional element and the wall portion. In this case, the pillar can support an area between the functional element and the wall portion, where the lid portion easily deforms, while securing the size of the cavity.

The above-referenced pillar may double as an external connection electrode that is electrically connected to the functional element. In this way, the pillar can fulfill a roll in both preventing deformation of the lid portion and electrically connecting to the functional element.

BRIEF DESCRIPTION OF THE DRAWINGS

Various embodiments will be described with reference to the accompanying drawings, wherein like numbers reference like elements.

DETAILED DESCRIPTION

The following describes embodiments of the invention in detail with reference to the accompanying drawings. It should be noted that the same constituent element is assigned the same reference sign, and redundant descriptions are omitted.

A MEMS device according to one or more embodiments of the invention is a device in which a functional element, such as a resonator, a sensor and an actuator, and an electronic circuit are integrated on one substrate.

Below, as one example, a MEMS device will be described that includes a resonator with capacitance as a functional element, and also includes a MOS field-effect transistor as a semiconductor circuit element. The resonator is airtightly sealed in a cavity formed in a trench (a recessed portion in a surface) of a semiconductor substrate.

First Embodiment

Figure 1:
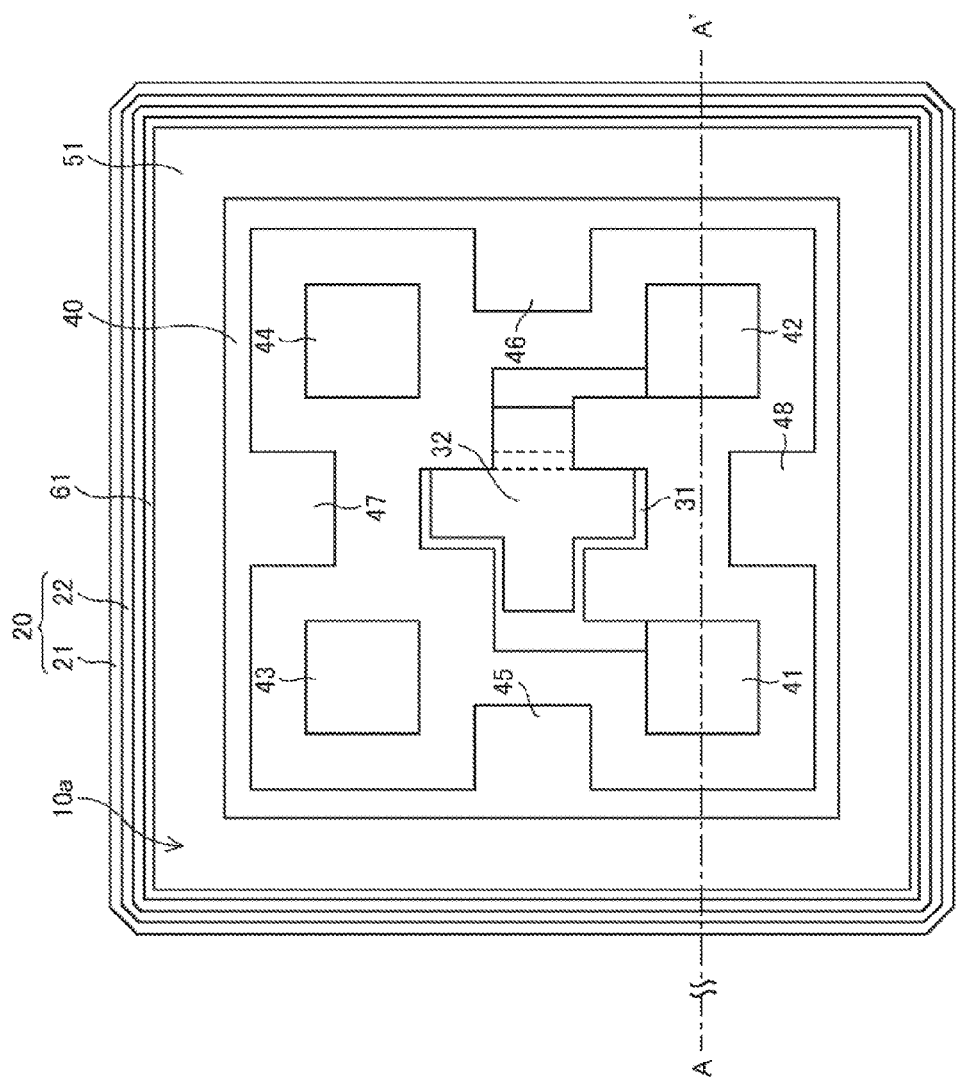
FIG. 1 is a plan view showing the inside of a trench of a MEMS device according to a first embodiment of the invention.
Figure 2:
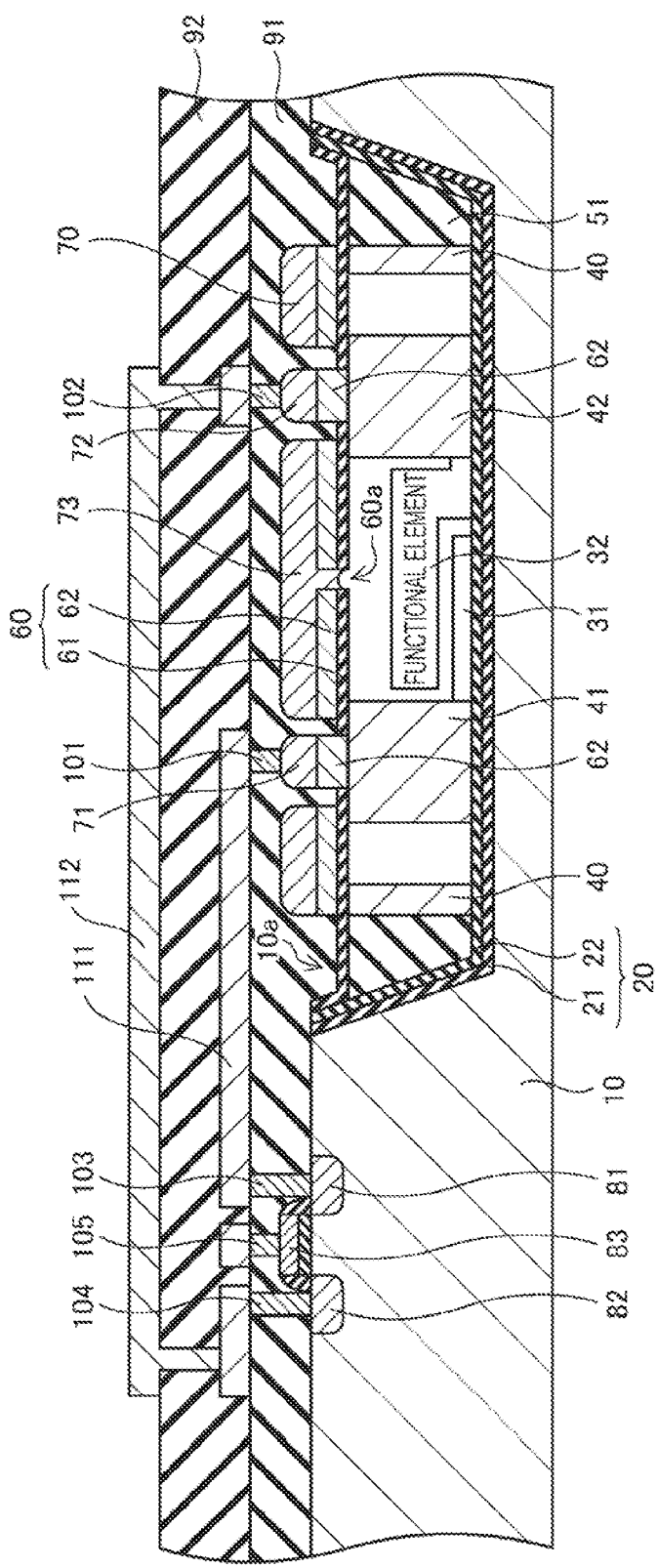
FIG. 2 is a cross-sectional view, taken along the line A-A' of FIG. 1, showing major portions of the MEMS device.

FIG. 1 is a plan view showing a structure of the inside of a trench of a MEMS device according to a first embodiment of the invention. FIG. 1 shows the structure of the inside of trench before a cavity is covered by a lid portion. FIG. 2 is a cross-sectional view, taken along the line A-A' of FIG. 1, showing major portions of the MEMS device. As shown in FIG. 2, this MEMS device uses a semiconductor substrate 10 whose main surface (an upper surface in the figure) has a first region (the right side in the figure) in which a trench 10a is formed and a second region (the left side in the figure) in which impurity diffusion regions of a semiconductor circuit element are formed.

A resonator including a lower electrode 31 and an upper electrode 32 is provided on a bottom surface of the trench 10a of the semiconductor substrate via an insulating film 20. The upper electrode 32 of the resonator includes a cantilever-like structural member that is fixed at one end and movable at the other end.

Also, a wall portion 40 that forms a cavity surrounding the resonator is provided in the trench 10a of the semiconductor substrate. At least one pillar is provided in the cavity formed by the wall portion 40. As one example, FIG. 1 shows pillars 41 to 48, and FIG. 2 shows only the pillars 41 and 42, which are positioned on the line A-A' of FIG. 1, among the pillars 41 to 48.

In this example, the lower electrode 31, the upper electrode 32, the wall portion 40 and the pillars 41 to 48 are provided on the bottom surface of the trench 10a of the semiconductor substrate via the insulating film 20. However, the lower electrode 31, the upper electrode 32, the wall portion 40 and the pillars 41 to 48 may be provided directly on the bottom surface of the trench 10a of the semiconductor substrate. Also, an insulating film 51 that reinforces the wall portion 40 is provided so as to surround the wall portion 40.

For example, the insulating film 20 includes an insulating film 21 of silicon dioxide ($SiO_2$) and an insulating film 22 of silicon nitride (SiN). The lower electrode 31, the upper electrode 32, the wall portion 40 and the pillars 41 to 48 are formed of, for example, polysilicon that has been doped with impurities and has electrical conductivity. The insulating film 51 is formed of silicon dioxide ($SiO_2$) and the like.

The pillars 41 to 48 have, for example, a shape of a prism or a cylinder. Among the pillars 41 to 48, the pillars 41 and 42 double as two external connection electrodes that respectively bring the lower electrode 31 and the upper electrode 32 of the resonator into electrical connection to the electronic circuit. Therefore, the pillar 41 is electrically connected to the lower electrode 31, and may be constructed integrally with the lower electrode 31. On the other hand, the pillar 42 is electrically connected to the upper electrode 32, and may be constructed integrally with the upper electrode 32.

In the trench 10a of the semiconductor substrate, a region surrounded by the wall portion 40 is the cavity. The space in the cavity is a high vacuum region. By applying an alternating current voltage between the lower electrode 31 and the upper electrode 32 in the resonator provided in the cavity, mechanical oscillation of the upper electrode 32 is excited by an electrostatic force, and a change in capacitance between the lower electrode 31 and the upper electrode 32 attributed to this mechanical oscillation is detected.

As shown in FIG. 2, the cavity is covered by a lid portion including a first lid portion 60 and a second lid portion 70, in such a manner that a gap is present between the lid portion and the resonator. The first lid portion 60 includes, for example, an insulating film 61 of silicon nitride (SiN) and the like, and a polysilicon film 62 that has electrical conductivity. It should be noted that a surface of the polysilicon film 62 may be provided with a titanium nitride (TiN) film, a salicide film, or the like.

A part of the polysilicon film 62 is provided in a predetermined region of a main surface (an upper surface in the figure) of the pillar 41, and is electrically connected to the pillar 41. Another part of the polysilicon film 62 that is insulated from the above-referenced part is provided in a predetermined region of a main surface (an upper surface in the figure) of the pillar 42, and is electrically connected to the pillar 42.

An opening (release hole) 60a is formed in the first lid portion 60. The part of the first lid portion 60 other than the opening 60a covers the cavity. The opening 60a is used in removing, through release etching, a sacrificial film formed in the cavity. Thereafter, with the inside of the cavity placed in a decompressed state (vacuum state), the second lid portion 70 is formed on a surface of the first lid portion 60 using a sealant of aluminum (Al) and the like.

The second lid portion 70 includes an intermediate conductive member 71, an intermediate conductive member 72 and a sealing portion 73. The intermediate conductive member 71 is electrically connected to the pillar 41 via the polysilicon film 62 and insulated from other parts of the second lid portion 70. The intermediate conductive member 72 is electrically connected to the pillar 42 via the polysilicon film 62 and insulated from other parts of the second lid portion 70. The sealing portion 73 seals the opening 60a of the first lid portion.

In the cavity, the pillars 41 to 48 are in contact with the bottom surface of the trench 10a of the semiconductor substrate or the insulating film 20, and with a back surface of the lid portion (the insulating film 61 or the polysilicon film 62). It should be noted that the back surface of the lid portion denotes a surface toward the bottom surface of the trench 10a. This makes it possible to improve the mechanical strength of the structure of the cavity that houses the resonator in the trench 10a of the semiconductor substrate, and to prevent the lid portion, which covers the cavity, from deforming under mechanical stress. As a result, the airtightness of the cavity and the properties of the resonator are maintained.

Here, the pillars 45 to 48 are constructed integrally with the wall portion 40 as shown in FIG. 1. In this way, the positions of the pillars 45 to 48 are fixed by the wall portion 40. Accordingly, displacement and tilting of the pillars 45 to 48 caused by mechanical stress applied to a layer(s) above the cavity can be prevented.

On the other hand, the pillars 41 to 44 are provided in central parts between the resonator and the wall portion 40. In this case, the pillars 41 to 44 can support areas between the resonator and the wall portion 40, where the lid portion easily deforms, while securing the size of the cavity.

The pillars 41 and 42 also double as the external connection electrodes that are electrically connected to the resonator. In this way, the pillars 41 and 42 can fulfill a roll in both preventing deformation of the lid portion and electrically connecting to the resonator.

It is preferable that, in the trench 10a of the semiconductor substrate, the lower electrode 31 and the upper electrode 32 of the resonator, the wall portion 40 and the pillars 41 to 48 be provided in a region that is lower than the main surface of the semiconductor substrate 10. In this way, the cavity is formed in the region that is lower than the main surface of the semiconductor substrate 10, thereby allowing the lid portion to have a thickness sufficient to maintain the inside of the cavity in high vacuum.

Meanwhile, as shown in FIG. 2, the semiconductor circuit element is provided in the second region of the main surface of the semiconductor substrate 10. For example, impurity diffusion regions 81 and 82, which serve as a source and a drain of a MOS field-effect transistor (MOSFET), are provided inside the semiconductor substrate 10, and a gate electrode 83 is provided on the semiconductor substrate 10 via a gate insulating film.

A first insulating layer (inter-layer insulating film) 91 of silicon dioxide ($SiO_2$), BPSG (Boron Phosphorus Silicon Glass), or the like is provided on the semiconductor substrate 10 provided with the lid portion and the semiconductor circuit element. The first insulating layer 91 covers the main surface of the semiconductor substrate 10. The first insulating layer 91 is in contact with the insulating film 61 and insulates the intermediate conductive members 71 and 72 of the second lid portion 70 from the sealing portion 73.

Contact plugs (electrodes) 101 and 102 of tungsten (W) and the like are provided in a first region of the first insulating layer 91. The contact plugs 101 and 102 penetrate the first insulating layer 91 and are electrically connected to the intermediate conductive members 71 and 72, respectively. Also, contact plugs (electrodes) 103 to 105 of tungsten (W) and the like are provided in a second region of the first insulating layer 91. The contact plugs 103 to 105 penetrate the first insulating layer 91 and are electrically connected to the impurity diffusion region 81, the impurity diffusion region 82 and the gate electrode 83, respectively.

Electrical connection to the contact plugs 101 to 105 is implemented on a first wiring layer of aluminum (Al) and the like, which is provided on a surface of the first insulating layer 91. Furthermore, where necessary, a second wiring layer is provided via a second insulating layer 92, and a desired number of wiring layers are installed in a similar manner from then on. In addition, a protection film (not shown) is provided on a surface of a topmost wiring layer.

By thus providing the insulating layer 91 that covers the main surface of the semiconductor substrate 10 provided with the lid portion and the semiconductor circuit element, a wiring layer can be installed, using a standard semiconductor wafer process, on a layer(s) above the cavity that houses the functional element, similarly to a layer(s) above the semiconductor circuit element. Accordingly, a degree of freedom of design of the MEMS device is improved.

For example, wiring 111 provided on the first wiring layer brings the contact plug 101 and the contact plug 103 into electrical connection to each other. Also, wiring 112 provided on the second wiring layer brings the contact plug 102 and the contact plug 104 into electrical connection to each other via the first wiring layer. In this way, the resonator can be electrically connected to the semiconductor circuit element.

Here, it is preferable that the surface of the first insulating layer 91 on the lid portion be treated by CMP (Chemical Mechanical Polishing). In this way, the surface of the first insulating layer 91 on the lid portion is planarized, and formation of wiring on the first insulating layer 91 is made easy.

At the time of CMP treatment of the surface of the first insulating layer 91 on the lid portion, mechanical stress is applied to a layer(s) above the cavity. According to the present embodiment, by providing the pillars 41 to 48 in the cavity, the mechanical strength of the cavity structure can be improved, and the lid portion can be prevented from deforming under mechanical stress at the time of CMP treatment of the surface of the first insulating layer 91 on the lid portion.

In the examples shown in FIGS. 1 and 2, the resonator serving as the functional element is provided in a central part of the cavity. However, the functional element may be provided in a peripheral part of the cavity, and one pillar may be provided in the central part of the cavity so as to be in contact with a central part of the back surface of the lid portion. As the central part deforms most easily in the lid portion, by supporting the central part of the back surface of the lid portion with the pillar, deformation of the lid portion can be prevented effectively.

A description is now given of a method of manufacturing the MEMS device shown in FIGS. 1 and 2.

Figure 3A:
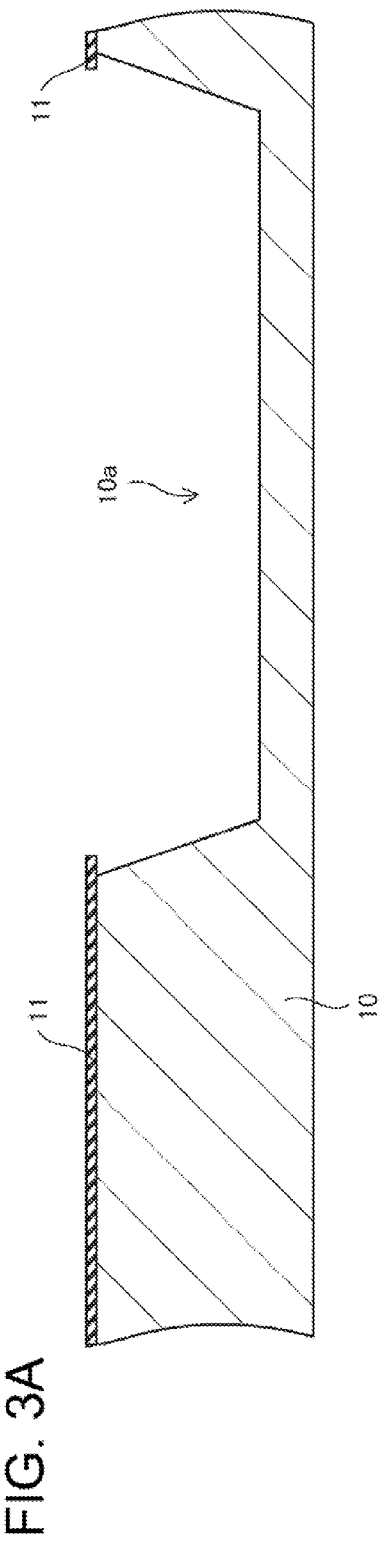
FIGS. 3A and 3B are cross-sectional views pertaining to manufacturing processes of the MEMS device according to the first embodiment of the invention.

FIGS. 3A to 4B are cross-sectional views pertaining to manufacturing processes of the MEMS device according to the first embodiment of the invention. First, for example, by providing a resist 11 using a photolithography technique and applying dry etching to a part of the main surface of the semiconductor substrate 10 constructed from a silicon monocrystal and the like, the deep trench 10a is formed in the first region of the main surface of the semiconductor substrate 10 as shown in FIG. 3A. Thereafter, the resist 11 is removed.

Figure 3B:
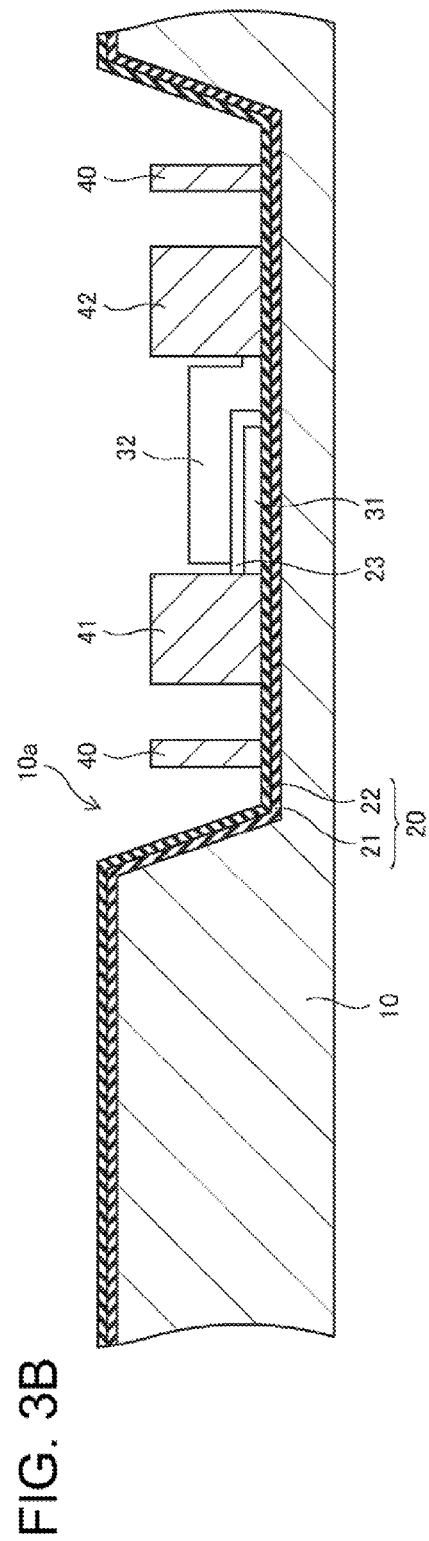

Next, as shown in FIG. 3B, the insulating film 20 is formed on the bottom surface of the trench 10a of the semiconductor substrate. For example, the insulating film 20 includes the insulating film 21 of silicon dioxide ($SiO_2$) and the insulating film 22 of silicon nitride (SiN). The insulating film 22 of silicon nitride (SiN) withstands wet etching (release etching) for removing the later-described sacrificial film in the cavity.

Also, for example, polysilicon that has been doped with impurities and has electrical conductivity is formed on the bottom surface of the trench 10a of the semiconductor substrate via the insulating film 20, and patterning is applied through dry etching that uses a resist. Consequently, the lower electrode 31 of the resonator is formed. Furthermore, after forming a gap sacrificial film 23 on the lower electrode 31, for example, polysilicon that has electrical conductivity is formed, and patterning is applied through dry etching that uses a resist. Consequently, the upper electrode 32 of the resonator, the wall portion 40 and the pillars 41 to 48 (FIG. 1) are formed. Thereafter, the gap sacrificial film 23 is removed through wet etching.

In this way, the resonator including the lower electrode 31 and the upper electrode 32 is formed on the bottom surface of the trench 10a of the semiconductor substrate via the insulating film 20, and the wall portion 40 that forms the cavity surrounding the resonator is formed in the trench 10a of the semiconductor substrate. The pillars 41 to 48 (FIG. 1) are also formed in the cavity. It should be noted that the lower electrode 31, the upper electrode 32, the wall portion 40 and the pillars 41 to 48 may be formed directly on the bottom surface of the trench 10a of the semiconductor substrate.

Figure 4A:
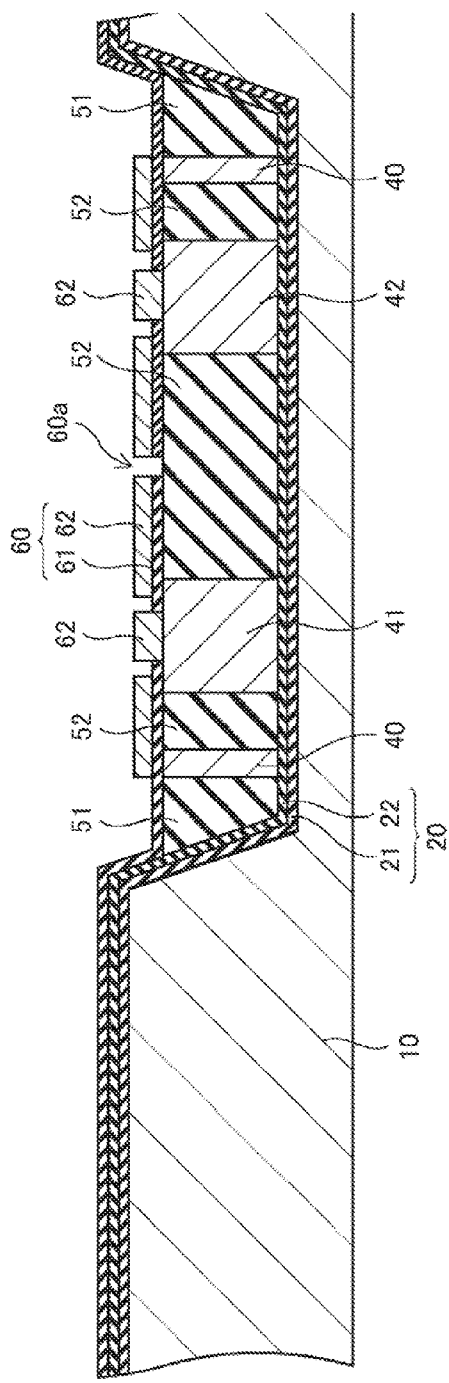
FIGS. 4A and 4B are cross-sectional views pertaining to manufacturing processes of the MEMS device according to the first embodiment of the invention.

Next, after an insulating film of silicon dioxide ($SiO_2$) and the like is deposited, using a plasma CVD technique, on the surface of the semiconductor substrate 10 on which the resonator and the like are formed, the insulating film of silicon dioxide ($SiO_2$) and the like is polished by CMP (Chemical Mechanical Polishing) and further etched. As a result, as shown in FIG. 4A, the insulating film 51 of silicon dioxide ($SiO_2$) and the like is formed so as to surround the wall portion 40 in the trench of the semiconductor substrate 10, and an insulating film 52 of silicon dioxide ($SiO_2$) and the like is formed as a sacrificial film in the cavity.

Next, after an insulating film of silicon nitride (SiN) and the like is formed on the surface of the semiconductor substrate 10 on which the insulating films 51 and 52 and the like are formed, patterning is applied to the insulating film of silicon nitride (SiN) and the like through dry etching that uses a resist. As a result, the insulating film 61 of silicon nitride (SiN) and the like, which covers parts of the main surfaces of the pillars 41 and 42 and parts of the insulating films 51 and 52, is formed.

Also, after a polysilicon film that has electrical conductivity is formed on the surface of the semiconductor substrate 10 on which the insulating film 61 and the like are formed, patterning is applied to the polysilicon film through dry etching that uses a resist. As a result, the first lid portion 60 including the insulating film 61 and the polysilicon film 62 is formed. The opening 60a is formed in the first lid portion 60. The part of the first lid portion 60 other than the opening 60a covers the cavity.

Here, a part of the polysilicon film 62 is provided in the predetermined region of the main surface of the pillar 41, and is electrically connected to the pillar 41. Another part of the polysilicon film 62 is provided in the predetermined region of the main surface of the pillar 42, and is electrically connected to the pillar 42.

Figure 4B:
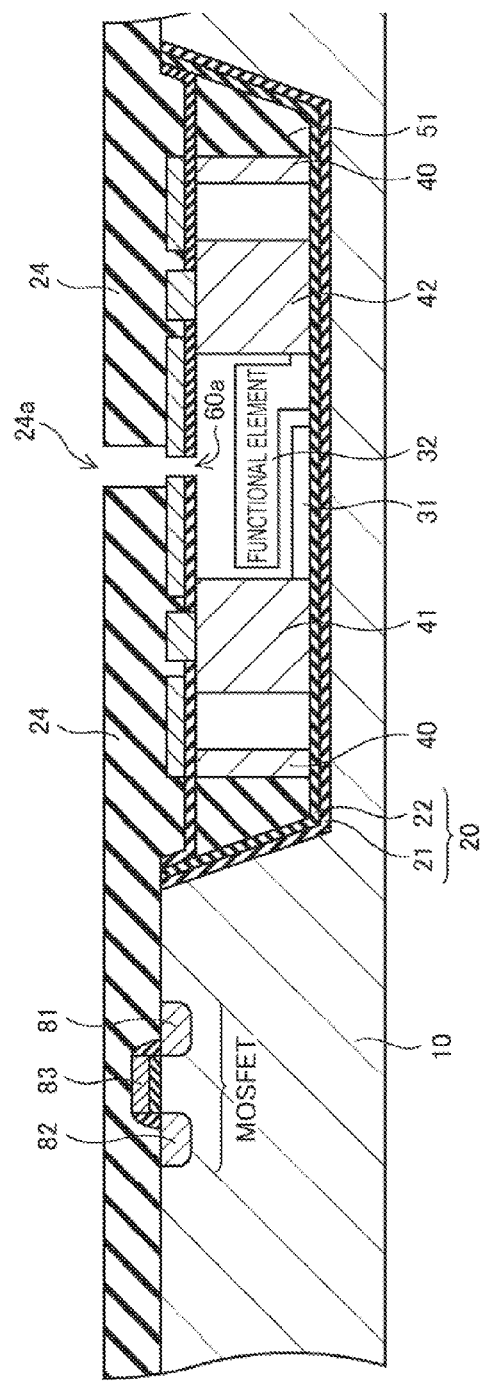

Next, insulating film planarization and the like are applied to the surface of the semiconductor substrate 10 on which the first lid portion 60 and the like are formed. Thereafter, for example, a MOS field-effect transistor (MOSFET) is formed as a semiconductor circuit element in the second region of the main surface of the semiconductor substrate 10 as shown in FIG. 4B.

That is to say, the gate electrode 83 is formed on the semiconductor substrate 10 via the gate insulating film, and the impurity diffusion regions 81 and 82 that serve as the source and the drain are formed inside the semiconductor substrate 10 on both sides of the gate electrode 83. Also, insulating side walls may be formed on side walls of the gate insulating film and the gate electrode 83. Furthermore, an insulating film of a predetermined thickness may be formed in a region surrounding the insulating side walls.

Next, a resist 24 that has an opening 24a in a position corresponding to the opening 60a of the first lid portion is provided, using a photolithography technique, on the surface of the semiconductor substrate 10 on which the MOS field-effect transistor and the like are formed. Furthermore, the insulating film of silicon dioxide ($SiO_2$) and the like in the cavity, that is to say, the sacrificial film is removed through wet etching (release etching) that uses hydrofluoric acid and the like as an etchant. Thereafter, the resist 24 is removed through asking and the like.

Next, a sealant of aluminum (Al) and the like is deposited on the surface of the first lid portion 60 through sputtering (a high vacuum film formation technique) in a vacuum chamber, and patterning is applied to the deposited sealant through dry etching that uses a resist. In this way, as shown in FIG. 2, the second lid portion 70 is formed on the surface of the first lid portion 60 by the sealant.

The second lid portion 70 includes the intermediate conductive member 71 that is electrically connected to a predetermined region of the pillar 41 via the polysilicon film 62, the intermediate conductive member 72 that is electrically connected to a predetermined region of the pillar 42 via the polysilicon film 62, and the sealing portion 73 that seals the opening 60*a* of the first lid portion.

Next, the first insulating layer 91 is formed of silicon dioxide ($SiO_2$), BPSG, or the like. The first insulating layer 91 covers the main surface of the semiconductor substrate 10 on which the first lid portion 60, the second lid portion 70 and the semiconductor circuit element are formed. The first insulating layer 91 is in contact with the insulating film 61 and insulates the intermediate conductive members 71 and 72 of the second lid portion 70 from the sealing portion 73. Furthermore, it is preferable that the surface of the first insulating layer 91 be treated by CMP (Chemical Mechanical Polishing). In this way, the surface of the first insulating layer 91 is planarized, and formation of wiring on the first insulating layer 91 is made easy.

Next, the contact plugs 101 to 105 of tungsten (W) and the like are simultaneously formed. The contact plugs 101 and 102 penetrate the first insulating layer 91 and are electrically connected to the intermediate conductive members 71 and 72, respectively, whereas the contact plugs 103 to 105 penetrate the first insulating layer 91 and are electrically connected to the semiconductor circuit element.

Next, the first wiring layer is formed on the surface of the first insulating layer 91 by aluminum (Al) and the like. Electrical connection to the contact plugs 101 to 105 is implemented on the first wiring layer. For example, the wiring 111 provided on the first wiring layer brings the contact plug 101 and the contact plug 103 into electrical connection to each other.

Furthermore, where necessary, the second wiring layer is formed via the second insulating layer 92, and a desired number of wiring layers are formed in a similar manner from then on. For example, the wiring 112 provided on the second wiring layer brings the contact plug 102 and the contact plug 104 into electrical connection to each other via the first wiring layer.

In this way, the resonator can be electrically connected to the semiconductor circuit element. In this way, a necessary number of wiring layers can be installed, using a standard semiconductor wafer process, on a layer(s) above the cavity that houses the resonator, similarly to a layer(s) above the semiconductor circuit element. Thereafter, the protection film (not shown) is formed on the surface of a topmost wiring layer.

Second Embodiment

Figure 5:
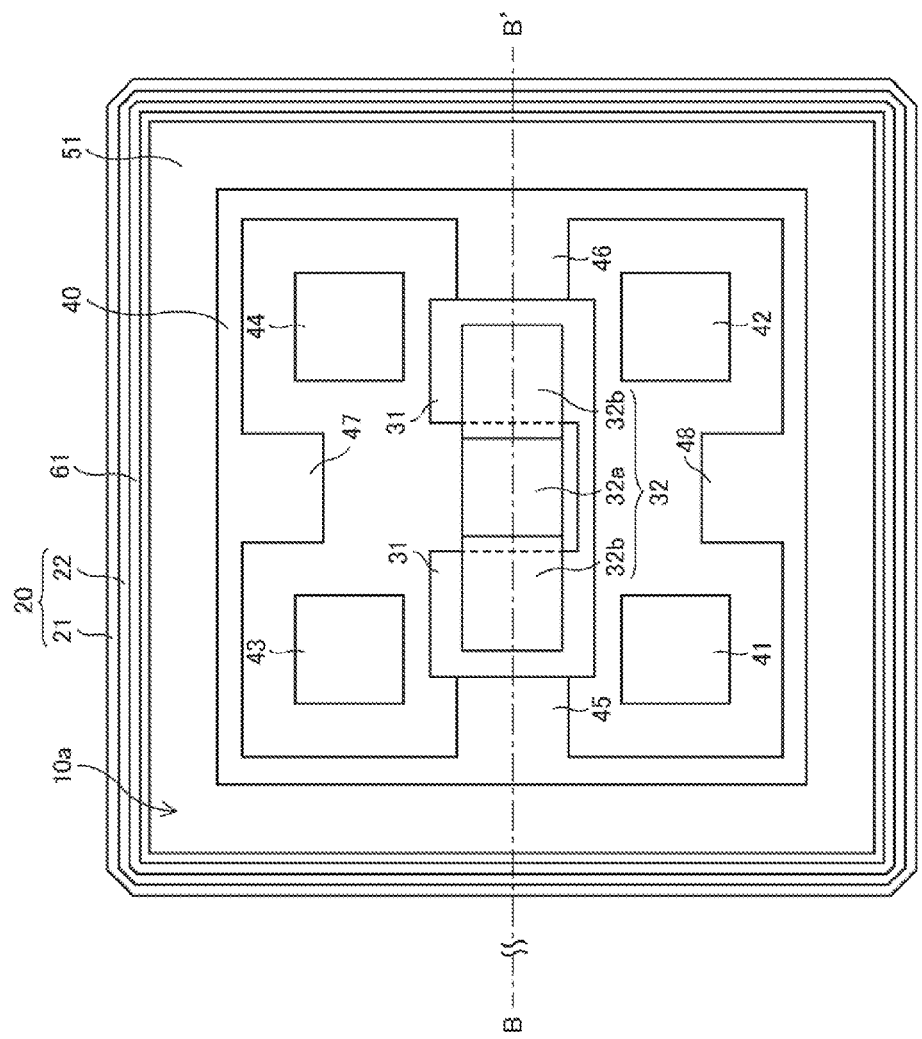
FIG. 5 is a plan view showing the inside of a trench of a MEMS device according to a second embodiment of the invention.
Figure 6:
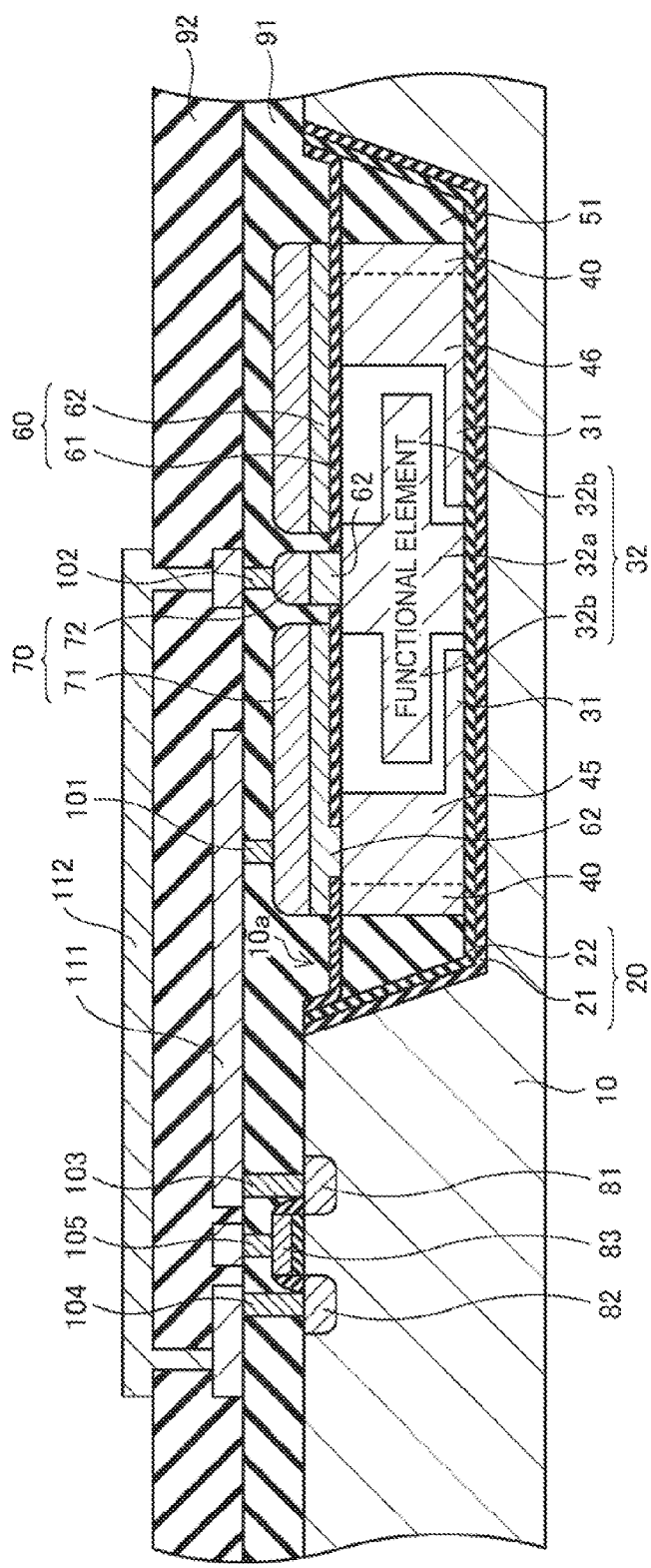
FIG. 6 is a cross-sectional view, taken along the line B-B' of FIG. 5, showing major portions of the MEMS device.

FIG. 5 is a plan view showing a structure of the inside of a trench of a MEMS device according to a second embodiment of the invention. FIG. 5 shows the structure of the inside of trench before a cavity is covered by a lid portion. FIG. 6 is a cross-sectional view, taken along the line B-B' of FIG. 5, showing major portions of the MEMS device. In the second embodiment, at least apart of a functional element constitutes a pillar. In other respects, the second embodiment is similar to the first embodiment.

A resonator including a lower electrode 31 and an upper electrode 32 is provided on a bottom surface of a trench 10*a* of a semiconductor substrate via an insulating film 20. Here, apart of the upper electrode 32 constitutes a pillar 32*a*. Furthermore, the upper electrode 32 includes two cantilever-like structural members 32*b* each of which is fixed to the pillar 32*a* at one end and movable at the other end.

Also, a wall portion 40 that forms a cavity surrounding the resonator is provided in the trench 10*a* of the semiconductor substrate. At least one pillar may be provided in the cavity formed by the wall portion 40. As one example, FIG. 5 shows pillars 41 to 48, and FIG. 6 shows only the pillars 45 and 46, which are positioned on the line B-B' of FIG. 5, among the pillars 41 to 48.

In this example, the lower electrode 31, the upper electrode 32, the wall portion 40 and the pillars 41 to 48 are provided on the bottom surface of the trench 10*a* of the semiconductor substrate via the insulating film 20. However, the lower electrode 31, the upper electrode 32, the wall portion 40 and the pillars 41 to 48 may be provided directly on the bottom surface of the trench 10*a* of the semiconductor substrate. Also, an insulating film 51 that reinforces the wall portion 40 is provided so as to surround the wall portion 40.

Here, the pillar 45 and the pillar 32*a*, which is constituted by a part of the upper electrode 32, double as two external connection electrodes that respectively bring the lower electrode 31 and the upper electrode 32 of the resonator into electrical connection to an electronic circuit. The pillar 45 is electrically connected to the lower electrode 31, and may be constructed integrally with the lower electrode 31. On the other hand, the pillar 32*a* is electrically connected to the two structural members 32*b*, and may be constructed integrally with the two structural members 32*b*.

In the trench 10*a* of the semiconductor substrate, a region surrounded by the wall portion 40 is the cavity. The space in the cavity is a high vacuum region. By applying an alternating current voltage between the lower electrode 31 and the upper electrode 32 in the resonator provided in the cavity, mechanical oscillation of the structural members 32*b* of the upper electrode 32 is excited by an electrostatic force, and a change in capacitance between the lower electrode 31 and the upper electrode 32 attributed to this mechanical oscillation is detected.

As shown in FIG. 6, the cavity is covered by a lid portion including a first lid portion 60 and a second lid portion 70. The first lid portion 60 includes, for example, an insulating film 61 of silicon nitride (SiN) and the like, and a polysilicon film 62 that has electrical conductivity. It should be noted that a surface of the polysilicon film 62 may be provided with a titanium nitride (TiN) film, a salicide film, or the like.

A part of the polysilicon film 62 is provided in a predetermined region of a main surface (an upper surface in the figure) of the pillar 45, and is electrically connected to the pillar 45. Another part of the polysilicon film 62 is provided in a predetermined region of a main surface (an upper surface in the figure) of the pillar 32*a*, and is electrically connected to the pillar 32*a*.

In the first lid portion 60, an opening (release hole) is formed in a position that is not shown in FIG. 6. The part of the first lid portion 60 other than the opening covers the cavity. The opening is used in removing, through release etching, a sacrificial film formed in the cavity. Thereafter, with the inside of the cavity placed in a decompressed state (vacuum state), the second lid portion 70 is formed on a surface of the first lid portion 60 using a sealant of aluminum (Al) and the like.

The second lid portion 70 includes an intermediate conductive member 71 and an intermediate conductive member 72. The intermediate conductive member 71 is electrically connected to the pillar 45 via the polysilicon film 62 and seals the opening of the first lid portion 60. The intermediate conductive member 72 is electrically connected to the pillar 32*a* via the polysilicon film 62 and insulated from other parts of the second lid portion 70. Other structures are similar to those in the first embodiment.

Here, in a case where the intermediate conductive member 71 is connected to wiring of a reference potential (for example, a ground potential of 0 V), the wall portion 40, the pillars 45 to 48, and most parts of the lid portion can fulfill a role of a shield that protects the resonator from the influences of electromagnetic waves generated by external electronic devices. In this case, the shielding effects may be enhanced by expanding the lower electrode 31 across a region of a bottom surface of the cavity other than a region surrounding the pillar 32*a*. Such a structure in which the role of the shield can be fulfilled is not limited to being applied to the present embodiment, and is naturally applicable to the first embodiment as well.

According to the second embodiment, at least a part of the functional element constitutes a pillar, and hence the space in the cavity can be utilized effectively. Also, as the pillar constituted by at least a part of the functional element doubles as the external connection electrode, both of prevention of deformation of the lid portion and electrical connection to the functional element are accomplished. Furthermore, providing one pillar in a central part of the cavity brings that pillar in contact with a central part of a back surface of the lid portion. As the central part deforms most easily in the lid portion, by supporting the central part of the back surface of the lid portion with the pillar, deformation of the lid portion can be prevented effectively.

While the above-described embodiments have discussed a MEMS device that includes a resonator as a functional element, the embodiments are by no means limited to the above-described examples. For example, various embodiments can be utilized in a MEMS device that includes a functional element such as a sensor and an actuator, and can be modified in many ways by a person of ordinary skill in the art within the technical ideas of the various embodiments.

What is claimed is:

1. A MEMS device, comprising:
   a semiconductor substrate having a main surface with a first region in which a trench is formed and a second region in which an impurity diffusion region of a semiconductor circuit element is formed;
   a functional element provided, either directly or via an insulating film, on a bottom surface of the trench of the semiconductor substrate;
   a wall portion in the trench of the semiconductor substrate and forming a cavity surrounding the functional element;
   a lid portion that covers the cavity and includes a front surface and an edge between a top surface and a back surface defined by a thickness of the lid portion, wherein the back surface is a bottom surface of the lid portion facing the bottom surface of the trench; and
   a plurality of pillars in the cavity that are separated from the wall portion and in contact with either the bottom surface of the trench of the semiconductor substrate or the insulating film, and with the back surface of the lid portion.

2. The MEMS device according to claim 1, further comprising:
   an insulating layer that covers the main surface of the semiconductor substrate, the insulating layer provided with the lid portion and the semiconductor circuit element.

3. The MEMS device according to claim 2, wherein a surface of the insulating layer on the lid portion is treated by Chemical Mechanical Polishing (CMP).

4. The MEMS device according to claim 1, wherein the pillar is in contact with a central part of the back surface of the lid portion.

5. The MEMS device according to claim 1, wherein at least a part of the functional element constitutes the pillar.

6. The MEMS device according to claim 1, wherein the pillar is constructed integrally with the wall portion.

7. The MEMS device according to claim 1, wherein the pillar is in a central part between the functional element and the wall portion.

8. The MEMS device according to claim 1, wherein the pillar is configured to operate as an external connection electrode that is electrically connected to the functional element.

9. The MEMS device according to claim 1, wherein the functional element is provided directly on the bottom surface of the trench of the semiconductor substrate.

10. The MEMS device according to claim 1, wherein the functional element is provided on the bottom surface of the trench of the semiconductor substrate via an insulating film.

11. The MEMS device according to claim 1, wherein the functional element comprises one of a resonator, a sensor or an actuator.

12. The MEMS device according to claim 1, wherein the functional element and the semiconductor circuit element are integrated on the semiconductor substrate.

13. The MEMS device according to claim 1, wherein the lid portion includes an opening formed therein.

14. The MEMS device according to claim 1, wherein the lid portion is a planar layer with the pillar in contact with the back surface of the planar layer.

15. The MEMS device according to claim 1, wherein a portion of the back surface of the lid portion extends along a top portion of the pillar and is configured to support a portion of the lid portion from deformation.

16. A MEMS device, comprising:
   a semiconductor substrate having a main surface with a first region in which a trench is formed and a second region in which an impurity diffusion region of a semiconductor circuit element is formed;
   a functional element on a bottom surface of the trench of the semiconductor substrate, the functional element including a lower electrode and an upper electrode;
   a wall portion in the trench of the semiconductor substrate and forming a cavity surrounding the functional element;
   a lid portion that covers the cavity and is separated from the functional element by a gap, the lid portion including a front surface and an edge between a top surface and a back surface defined by a thickness of the lid portion, wherein the back surface is a bottom surface of the lid portion facing the bottom surface of the trench; and a plurality of pillars in the cavity that are separated from the wall portion and in contact with the bottom surface of the trench of the semiconductor substrate, with the lower electrode of the functional element and with the back surface of the lid portion.

* * * * *